(12) United States Patent
Lin et al.

(10) Patent No.: US 10,516,035 B2
(45) Date of Patent: Dec. 24, 2019

(54) SEMICONDUCTOR DEVICE STRUCTURE WITH A LOW-K SPACER LAYER AND METHOD FOR MANUFACTURING THE SAME

(71) Applicant: Taiwan Semiconductor Manufacturing Co., Ltd., Hsinchu (TW)

(72) Inventors: Hsiang-Wei Lin, New Taipei (TW); Chung-Chi Ko, Nantou (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/964,366

(22) Filed: Apr. 27, 2018

(65) Prior Publication Data

US 2019/0148511 A1    May 16, 2019

Related U.S. Application Data

(60) Provisional application No. 62/585,602, filed on Nov. 14, 2017.

(51) Int. Cl.
*H01L 29/66* (2006.01)
*H01L 29/78* (2006.01)
*H01L 29/423* (2006.01)
*H01L 29/51* (2006.01)

(52) U.S. Cl.
CPC .... *H01L 29/6656* (2013.01); *H01L 29/42364* (2013.01); *H01L 29/512* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 9,419,101 | B1 * | 8/2016 | Peng | H01L 29/6656 |
| 9,947,769 | B1 * | 4/2018 | Han | H01L 29/6656 |
| 2011/0031538 | A1 * | 2/2011 | Hsieh | H01L 29/6656 |
| | | | | 257/288 |
| 2012/0126331 | A1 * | 5/2012 | Lin | H01L 21/82341 |
| | | | | 257/369 |

OTHER PUBLICATIONS

Definition of protrude downloaded from URL<https://www.merriam-webster.com/dictionary/protrude> on Apr. 25, 2019 (Year: 2019).*

* cited by examiner

*Primary Examiner* — J. E. Schoenholtz
(74) *Attorney, Agent, or Firm* — McClure, Qualey & Rodack, LLP

(57) ABSTRACT

Semiconductor device structures and methods for manufacturing the same are provided. The semiconductor device structure includes a fin structure over a substrate. The semiconductor device structure also includes a gate structure over the fin structure. The semiconductor device structure further includes a source/drain structure adjacent to the gate structure. In addition, the semiconductor device structure includes a first spacer layer between the gate structure and the source/drain structure, wherein the first spacer layer has a protruding portion extending towards the substrate.

20 Claims, 10 Drawing Sheets

SEMICONDUCTOR DEVICE STRUCTURE WITH A LOW-K SPACER LAYER AND METHOD FOR MANUFACTURING THE SAME

PRIORITY CLAIM AND CROSS-REFERENCE

This application claims the benefit of U.S. Provisional Application No. 62/585,602, entitled "SEMICONDUCTOR DEVICE STRUCTURE AND METHOD FOR MANUFACTURING THE SAME" filed on Nov. 14, 2017, the entirety of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
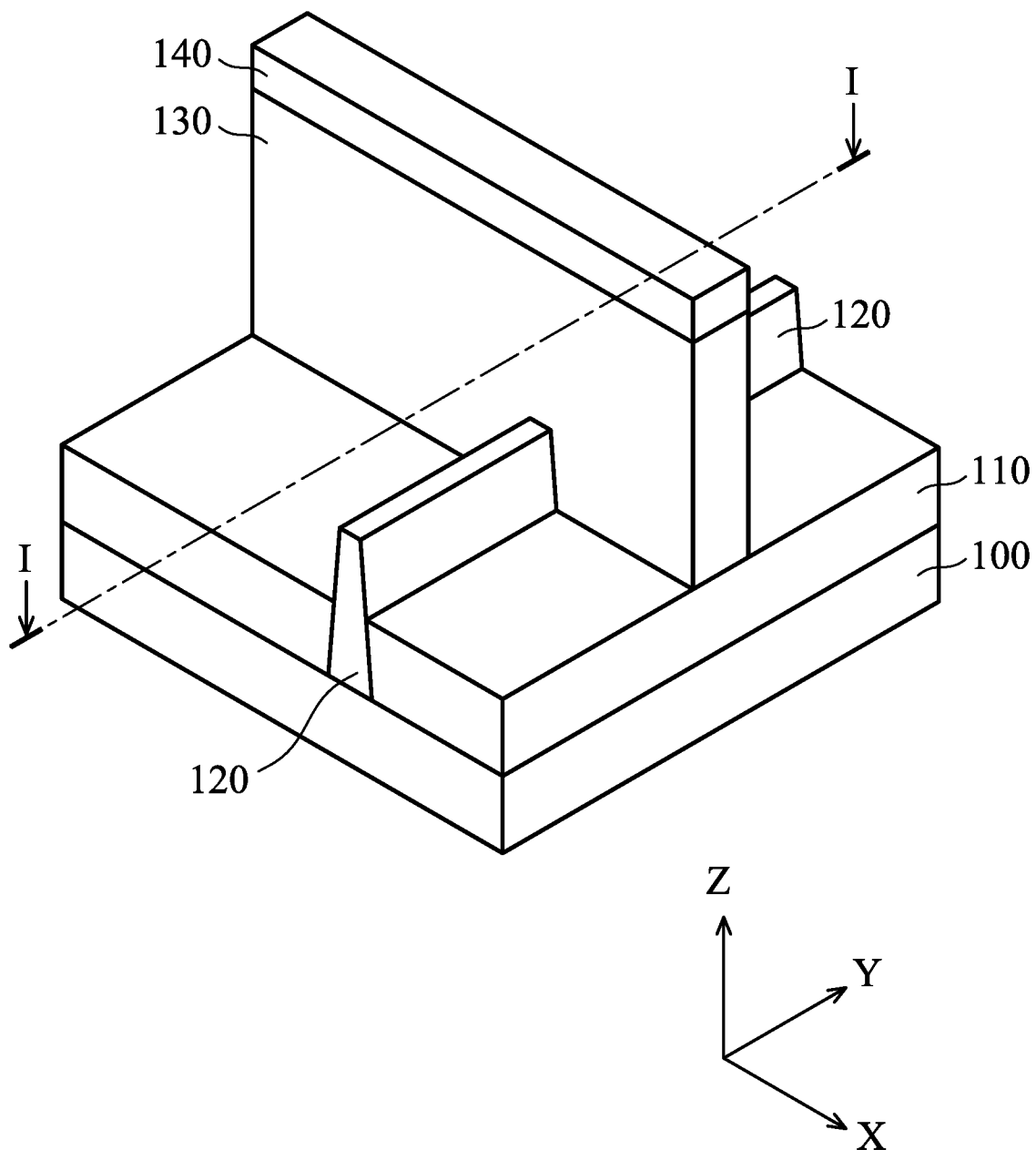
FIG. 1 is a perspective view of one stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches that are smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the disclosure form a semiconductor device structure. Some embodiments of the disclosure are described. FIG. 1 is a perspective view of one stage of a process for forming a semiconductor device structure, in accordance with some embodiments. For a better understanding of the semiconductor device structure, an X-Y-Z coordinate reference is provided in FIG. 1. The X-axis is generally orientated along a substrate surface of a semiconductor device structure in the lateral direction. The Y-axis is generally oriented along the substrate surface perpendicular to the X-axis. The Z-axis is generally oriented along direction perpendicular to the X-Y plane.

FIGS. 2A-2I are cross-sectional views of various stages of a process for forming semiconductor device structures, in accordance with some embodiments. In some embodiments, FIGS. 2A-2I are cross-sectional views taken along line I-I' shown in FIG. 1. Line I-I' may be substantially parallel to the Y-axis. More specifically, FIGS. 2A-2I illustrate the cross-sectional views of gate structure, spacer layers, source/drain structures and contact which are discussed in more detail below.

Figure 2A:
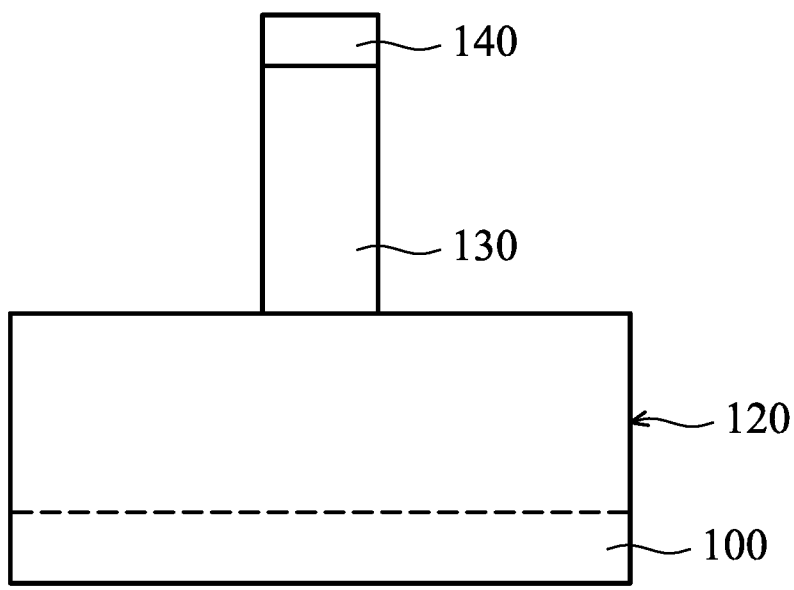
FIGS. 2A-2I are cross-sectional views of various stages of a process for forming a semiconductor device structure, in accordance with some embodiments.

As shown in FIGS. 1 and 2A, a substrate 100 is received. The surface of the substrate 100 is substantially parallel to the X-Y plane. In some embodiments, the substrate 100 may be a semiconductor substrate, such as a bulk semiconductor, a semiconductor-on-insulator (SOI) substrate, or the like, which may be doped (e.g. with a P-type or an N-type dopant) or undoped. The substrate 100 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 1, isolation structures 110 and a fin structure 120 are formed over the substrate 100. The fin structure 120 extends along the Y-axis as shown in FIGS. 1 and 2A. In some embodiments, the fin structure 120 is formed by performing a patterning process on the substrate 100. The fin structure 120 may be surrounded by trenches (not shown) formed in the substrate 100 by the patterning process. The isolation structures 110 (e.g. shallow trench isolation (STI) structures) may be formed to fill the trenches. A lower portion of the fin structure 120 is surrounded by the isolation structures 110, and an upper portion of the fin structure 120 protrudes from the top surface of each of the isolation structures 110.

After the isolation structures 110 and the fin structure 120 are formed, a dummy gate structure 130 is formed over the fin structure 120, as shown in FIGS. 1 and 2A in accordance with some embodiments. In addition, a hard mask layer 140 is formed on the dummy gate structure 130. In some embodiments, the dummy gate structure 130 covers a channel region in the fin structure 120. In some embodiments, the dummy gate structure 130 covers the top surface and sidewalls of the fin structure 120, and extends along the X-axis.

In some embodiments, the dummy gate structure 130 includes a gate dielectric (not shown) and a gate electrode (not shown) formed over the gate dielectric. In some embodiments, the gate dielectric is silicon dioxide. In some embodiments, the silicon dioxide is a thermally grown oxide. In some embodiments, the gate dielectric is a high dielectric constant (high-k) dielectric material. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode includes polycrystalline-silicon (poly-Si), polycrystalline silicon-germanium (poly-SiGe), metallic nitride, metallic silicide, metallic oxide, metal, and other suitable layers. In some embodiments, the gate electrode is made of, for example, polysilicon.

In some embodiments, the hard mask layer 140 includes a single layer structure or a multi-layer structure. In some embodiments, the hard mask layer 140 is made of silicon oxide, silicon nitride, silicon oxynitride, silicon carbide, another suitable material, or a combination thereof.

In some embodiments, the formation of the dummy gate structure 130 and the hard mask layer 140 includes deposition processes and a subsequent patterning process. The deposition processes are performed to deposit a gate dielectric material layer (not shown), a gate electrode material layer (not shown) and a hard mask material (not shown) in sequence. The patterning process is then performed to partially remove the gate dielectric material layer, the gate electrode material layer and a hard mask material. As a result, the dummy gate structure 130 and the overlying hard mask layer 140 are formed over the fin structure 120, as shown in FIGS. 1 and 2A. In some embodiments, the deposition processes include a chemical vapor deposition (CVD) process, a physical vapor deposition (PVD) process, an atomic layer deposition (ALD) process, a thermal oxidation process, or another applicable process. In some embodiments, the patterning process includes a photolithography process and a subsequent etching process. In some embodiments, the etching process is a dry etching process.

Figure 2B:
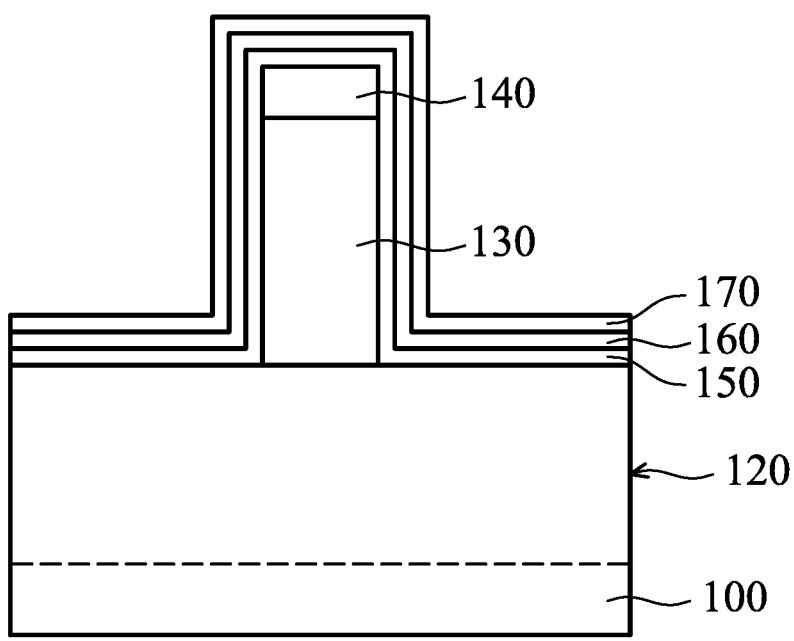

After the dummy gate structure 130 and the hard mask layer 140 are formed, a first dielectric layer 150, a second dielectric layer 160 and a third dielectric layer 170 are formed over the fin structure 120, the dummy gate structure 130 and the hard mask layer 140, as shown in FIG. 2B in accordance with some embodiments. As shown in FIG. 2B, the first dielectric layer 150, the second dielectric layer 160 and the third dielectric layer 170 are conformally formed over the dummy gate structure 130 and the hard mask layer 140. The first dielectric layer 150, the second dielectric layer 160 and the third dielectric layer 170 may be deposited using a chemical vapor deposition (CVD) process, a physical vapor deposition (PVD) process, another applicable process, or a combination thereof. The thickness of the first dielectric layer 150, the second dielectric layer 160 and the third dielectric layer 170 may be in a range of about 1 nm to about 1 μm.

In some embodiments, the first dielectric layer 150, the second dielectric layer 160 and the third dielectric layer 170 include Si atoms, O atoms, C atoms, N atoms, and H atoms with different respective component ratios. The first dielectric layer 150, the second dielectric layer 160 and the third dielectric layer 170 are made of different materials so that the subsequently formed first, second and third spacer layers have different etching rates in the subsequent etching processes. For example, the first dielectric layer 150 is an oxygen-rich material, and the second dielectric layer 160 and the third dielectric layer 170 are nitrogen-rich materials. The materials of the first dielectric layer 150, the second dielectric layer 160 and the third dielectric layer 170 will be described in more detail below.

Figure 2C:
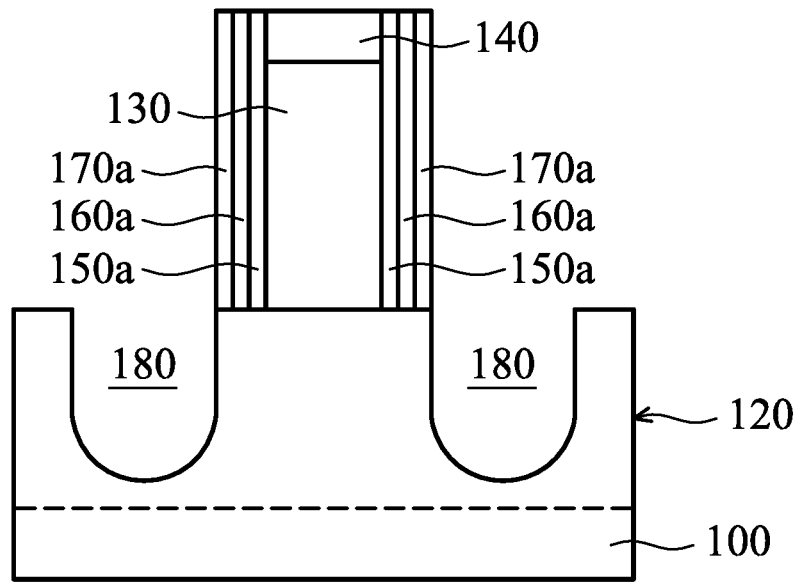

Next, one or more etching processes are performed to remove portions of the first dielectric layer 150, the second dielectric layer 160, the third dielectric layer 170 and the fin structure 120 to form recesses 180, as shown in FIG. 2C in accordance with some embodiments. In addition, the portions of the first dielectric layer 150, the second dielectric layer 160 and the third dielectric layer 170 that are over the hard mask layer 140 and over the fin structure 120 are removed, and the remaining portions of the first dielectric layer 150, the second dielectric layer 160 and the third dielectric layer 170 on sidewalls of the dummy gate structure 130 and the hard mask layer 140 form first spacer layers 150a, second spacer layers 160a and third spacer layers 170a are formed.

Afterwards, the top surface of the fin structure 120 is exposed, and portions of the fin structure 120 that are not covered by the hard mask layer 140, the first spacer layer 150a, the second spacer layer 160a and the third spacer layer 170a are removed. As a result, the recesses 180 are formed in the fin structure 120.

In some embodiments, the recesses 180 are adjacent to the third spacer layers 170a. In addition, bottoms of the recesses 180 may be positioned below the top surfaces of each of the isolation structures 110. The recesses 180 are configured to provide positions of source/drain structures formed in the subsequent processes. In some embodiments, the etching process includes a dry etching process. The dry etching process includes a plasma etching process or another applicable etching process. In some embodiments, the etchant used in the etching process contains carbon, chlorine and fluorine. For example, the etchant used in the etching process may include chlorine ($Cl_2$), tetrafluoromethane ($CF_4$), fluoromethane ($CH_3F$), hexa-fluoro-butadiene ($C_4F_6$), or another suitable etching gas. During the removal of the fin structure 120, the second spacer layers 160a and the third spacer layers 170a are used as protective layers to protect the dummy gate structure 130.

Figure 2D:
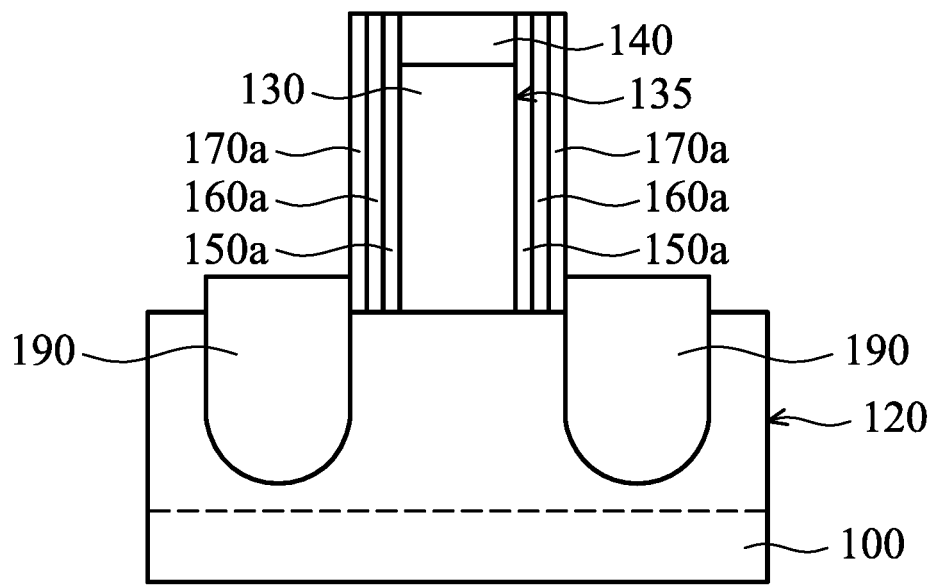

Subsequently, as shown in FIG. 2D, source/drain (S/D) structures 190 are formed over the recesses 180 of the fin structure 120, in accordance with some embodiments. The S/D structures 190 may be used to provide stress or strain to the channel region in the fin structure 120 below the subsequently formed metal gate structure. In addition, the S/D structures 190 partially overlap the third spacer layers 170a, as shown in FIG. 2D.

In some embodiments, a semiconductor material (or two or more semiconductor materials) is epitaxially grown over the recesses 180 of the fin structure 120, as shown in FIG. 2D. The semiconductor material is growing continually to form the S/D structures 190. In some embodiments, the S/D structures 190 are a single layer, as shown in FIG. 2D. In some embodiments, the S/D structures 190 are multi-layers and each layer has a different ratio of components.

In some embodiments, the S/D structures 190 include a P-type semiconductor material. For example, the S/D structures 190 may include epitaxially grown silicon or epitaxially grown silicon germanium. The S/D structures 190 are not limited to being a P-type semiconductor material. In some embodiments, the S/D structures 190 include an N-type semiconductor material. The S/D structures 190 may include epitaxially grown silicon, silicon-germanium (SiGe), epitaxially grown phosphorous-doped silicon (SiP), boron-doped silicon germanium (SiGeB) or another suitable epitaxially grown semiconductor material.

In some embodiments, the S/D structures 190 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the S/D structures 190 may use gaseous and/or liquid precursors.

In some embodiments, the S/D structures 190 are doped with one or more suitable dopants. For example, the S/D structures 190 are Si source or drain features doped with phosphorus (P), arsenic (As), or another suitable dopant. Alternatively, the S/D structures 190 are SiGe source or drain features doped with boron (B) or another suitable dopant. In some embodiments, multiple implantation processes are performed to dope the S/D structures 190. In some embodiments, the S/D structures 190 are further exposed to annealing processes to activate the dopants. For example, a rapid thermal annealing process is performed.

Figure 2E:
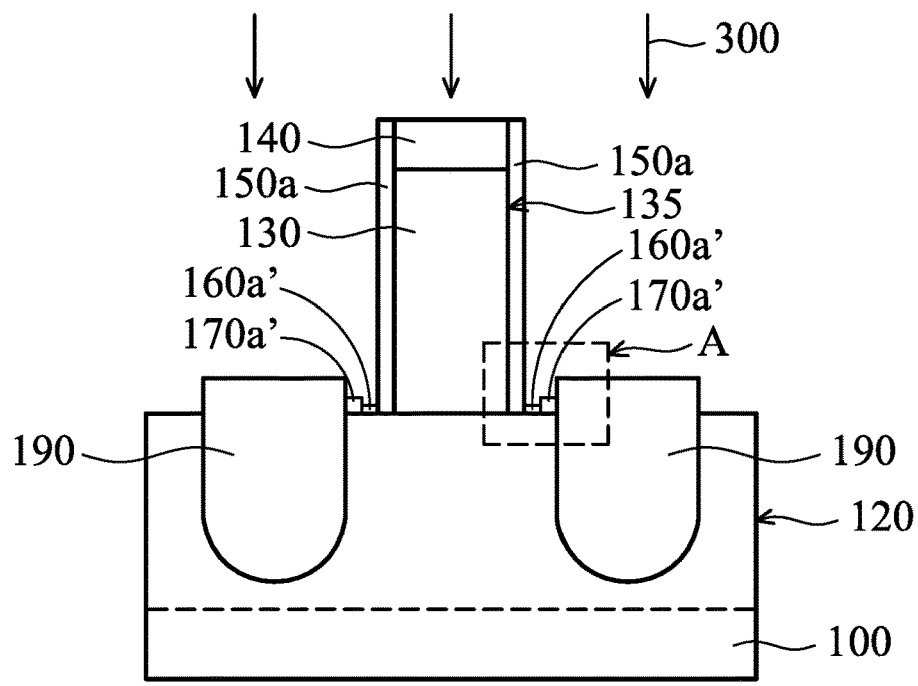

After the S/D structures 190 are formed, an etching process 300 is performed to remove portions of the second spacer layers 160a and the third spacer layers 170a to form the second spacer layers 160a' and the third spacer layers 170a', as shown in FIG. 2E in accordance with some embodiments.

In some embodiments, the etchant used in the etching process 300 has a high etching selectivity to the nitrogen-containing materials. For example, the etching process 300 may be a wet etching process, and use an etchant including $H_3PO_4$ or other suitable etchant. Alternatively, the etching process 300 may be a dry etching process such as a reactive-ion etching (RIE), and use an etchant including $CF_4$, $CHF_3$, $C_2F_6$, $C_3F_8$, $NF_3$ or other suitable etchant.

In some embodiments, the concentration of nitrogen (N) in the first spacer layer 150a is much lower than those in the second spacer layer 160a and the third spacer layer 170a so that an etching rate of the first spacer layer 150a is much slower than those of the second spacer layer 160a and the third spacer layer 170a during the etching process 300.

In some embodiments, the first spacer layer 150a is made of low dielectric constant (low-k) materials (e.g. k<5). For example, the first spacer layer 150a includes silicon oxide or silicon oxynitride or other low-k materials. In some embodiments, the concentration of nitrogen (N) in the first spacer layer 150a is lower than about 20 atomic percent (at. %).

In some embodiments, the second spacer layer 160a and the third spacer layer 170a are made of high-k materials (e.g. k>5). For example, the second spacer layer 160a and the third spacer layer 170a include SiON, SiCON, $Si_3N_4$ or other materials containing nitrogen atoms. In some embodiments, the concentration of nitrogen in the second spacer layer 160a and the third spacer layer 170a is in a range of about 40 at. % to about 65 at. %.

In some cases, the concentration of N in the first spacer layer 150a should not be higher than about 20 at. % and the concentration of N in the second spacer layer 160a and the third spacer layer 170a should not be lower than about 40 at. %. If the concentration of N in the first spacer layer 150a is higher than about 20 at. % and the concentration of N in the second spacer layer 160a and the third spacer layer 170a are lower than about 40 at. %, the difference of the etching rates between the first spacer layer 150a, the second spacer layer 160a and the third spacer layer 170a may not be high enough, which may lead to poor etching selectivity during the etching process 300. Furthermore, in some cases, the concentration of N in the second spacer layer 160a and the third spacer layer 170a should not be higher than about 65 at. %. If the concentration of N in the second spacer layer 160a and the third spacer layer 170a is higher than about 65 at. %, it may be too difficult to remove the second spacer layer 160a and the third spacer layer 170a.

In some embodiments, the concentration of N in the second spacer layer 160a is lower than that in the third spacer layer 170a so that the etching rate of the second spacer layer 160a is faster than the third spacer layer 170a during the etching process 300. As a result, the second spacer layer 160a' has a thickness that is less than that of the third spacer layer 170a' after the etching process 300, as shown in FIG. 2E.

Figure 3A:
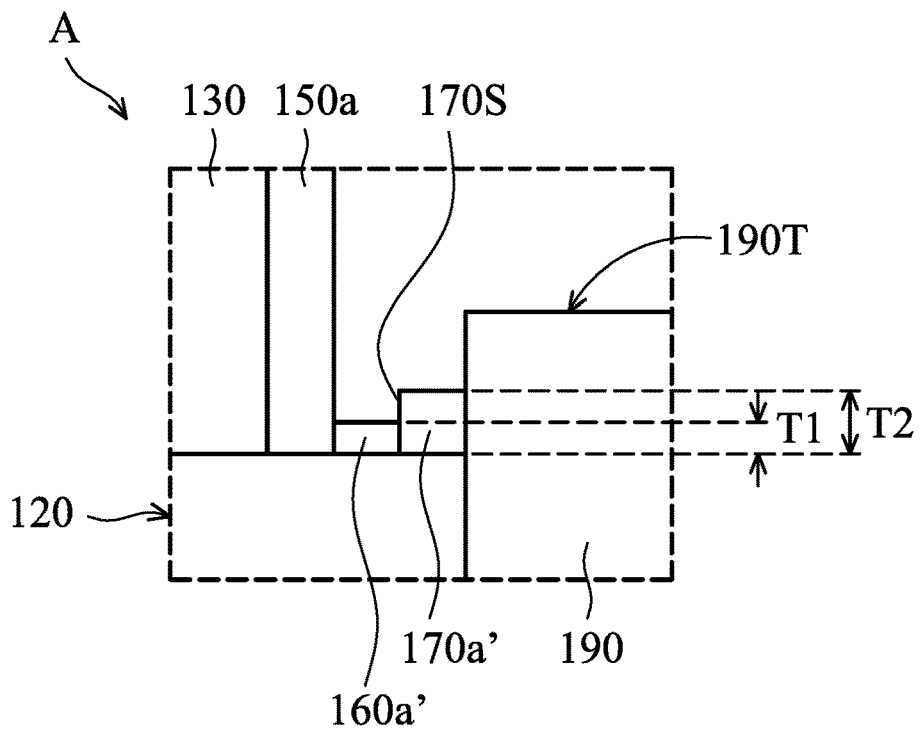
FIGS. 3A and 3B are partial enlarged views of area A of semiconductor device structures shown in FIGS. 2E and 2F, in accordance with some embodiments.

FIG. 3A is a partial enlarged view of area A of structures shown in FIG. 2E, in accordance with some embodiments. The concentration of N affects the density of the spacer layer. When the concentration of N is increased, the density of the spacer layer is increased accordingly so that the etching rate of the spacer layer is decreased. In some embodiments, the concentration of N in the second spacer layer 160a is lower than that of the third spacer layer 170a. In this embodiment, the second spacer layer 160a has a first etching rate, and the third spacer layer 170a has a second etching rate that is lower than the first etching rate during the etching process 300.

As shown in FIG. 3A, after the etching process 300 is performed to etch the second spacer layer 160a and the third spacer layer 170a, the surfaces of the second spacer layer 160a' and the third spacer layer 170a' are lower than the top surface 190T of the S/D structure 190. As mentioned above, the third spacer layers 170a are used as protective layers while the recesses 180 are formed as shown in FIG. 2C. Therefore, the density of the third spacer layers 170a should be high enough to resist over-etching during the formation of the recesses 180 described in FIG. 2C. As a result, the high concentration of N-containing material is used to ensure that the third spacer layers 170a have high density and low etching rate. For example, a material whose concentration of N is higher than 40 at. % is selected for use in the third spacer layers 170a.

The high concentration of N-containing material has a higher dielectric constant and may cause a higher degree of parasitic capacitance between subsequently formed metal gate structure and the S/D structures 190. Therefore, the third spacer layers 170a' are replaced by low-k material in the subsequent process. However, in some cases, when the etching process 300 is performed to remove the third spacer layers 170a until the top surfaces of the third spacer layers 170a' are lower than that of the S/D structures 190, it may become more difficult to remove the third spacer layer 170a' positioned in the trench between the first spacer layer 150a and the S/D structure 190. If the thickness of the third spacer layer 170a' is too thicker, higher parasitic capacitance may be generated and cause poor performance of the semiconductor device structure. However, when the etching process is performed until the third spacer layer 170a' is thin enough, the first spacer layer 150a and the dummy gate structure 130 may be etched. As a result, the profile of the subsequently formed metal gate structure is damaged, and the reliability or performance of the semiconductor device structure may be negatively affected.

In some embodiments, the second spacer layer 160a formed between the first spacer layer 150a and the third spacer layer 170a assists removal of the third spacer layer 170a. Since the concentration of N in the second spacer layer 160a is lower than that of the third spacer layer 170a, the etching rate of the second spacer layer 160a is faster than that of the third spacer layer 170a during the etching process 300. Since the second spacer layer 160a is removed faster than the third spacer layer 170a, a sidewall 170S of the third spacer layer 170a' is exposed during the etching process 300. Therefore, the total surface area of the third spacer layer 170a is increased, and the etching rate of the third spacer layer 170a is increased accordingly. As a result, the third spacer layer 170a can be etched efficiently without damage to the first spacer layer 150a and the dummy gate structure 130. More specifically, the third spacer layer 170a' has less thickness because of the formation of the second spacer layer 160a.

In some embodiments, as shown in FIG. 3A, the second spacer layer 160a' has a first thickness T1 and the third spacer layer 170a' has a second thickness T2 that is greater than the first thickness T1 after the etching process 300. In addition, the top surfaces of the second spacer layer 160a' and the third spacer layer 170a' are lower than the top surface 190T of the S/D structure 190. In some embodiments, an upper portion of the sidewall 170S of the third spacer layer 170a' is exposed, and a lower portion of the sidewall 170S of the third spacer layer 170a' is covered by the second spacer layer 160a', as shown in FIG. 3A.

In some embodiments, as shown in FIG. 3A, the width of the second spacer layer 160a' is the same as that of the third spacer layer 170a'. Many variations and/or modifications can be made to embodiments of the disclosure. In some embodiments, the width of the second spacer layer 160a' is greater than the width of the third spacer layer 170a'.

Figure 2F:
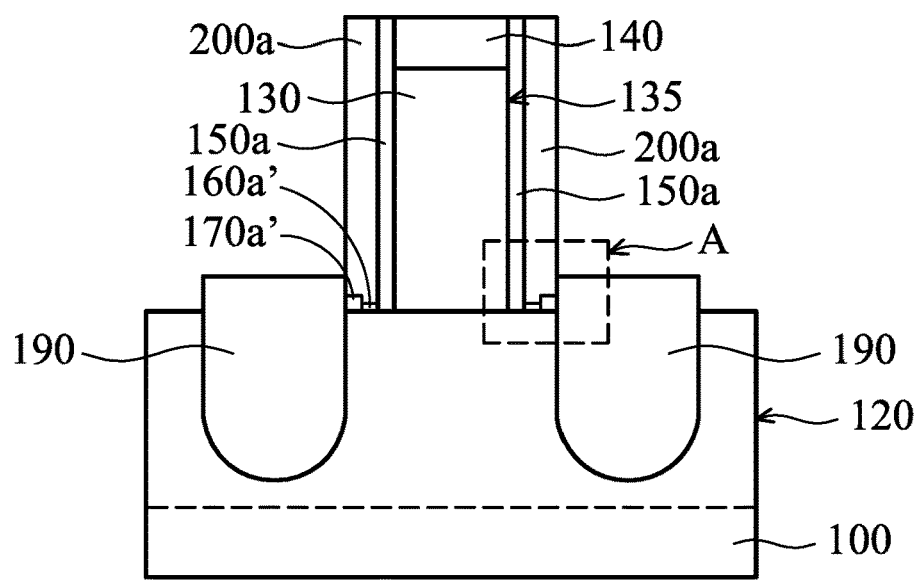

Next, fourth spacer layers 200a are formed over sidewalls of the first spacer layers 150a and over top surfaces of the second spacer layers 160a' and the third spacer layers 170a', as shown in FIG. 2F in accordance with some embodiments. In some embodiments, the fourth spacer layers 200a are made of low-k materials (e.g. with a dielectric constant that is lower than 5). In some embodiments, the material of the fourth spacer layers 200a is the same as or similar to that of the first spacer layer 150a. In some embodiments, the concentration of N in the fourth spacer layer 200a is lower than about 20 at. %.

In some embodiments, a low-k material is deposited over the hard mask layer 140, the first spacer layer 150a, the second spacer layers 160a', the third spacer layers 170a', the S/D structure 190 and the fin structure 120. The low-k material may be deposited by using a CVD process, a PVD process, a plasma enhanced chemical vapor deposition (PECVD) process, another applicable process, or a combination thereof. The thickness of the low-k material may be in a range of about 1 nm to about 1 µm. After the low-k material is deposited, an anisotropic etching process is performed so that the portions of the low-k material over the hard mask layer 140, the first spacer layer 150a, the S/D structure 190 and the fin structure 120 are removed, and the portions of the low-k material that remain on the sidewalls of the first spacer layer 150a form the fourth spacer layers 200a.

Figure 3B:
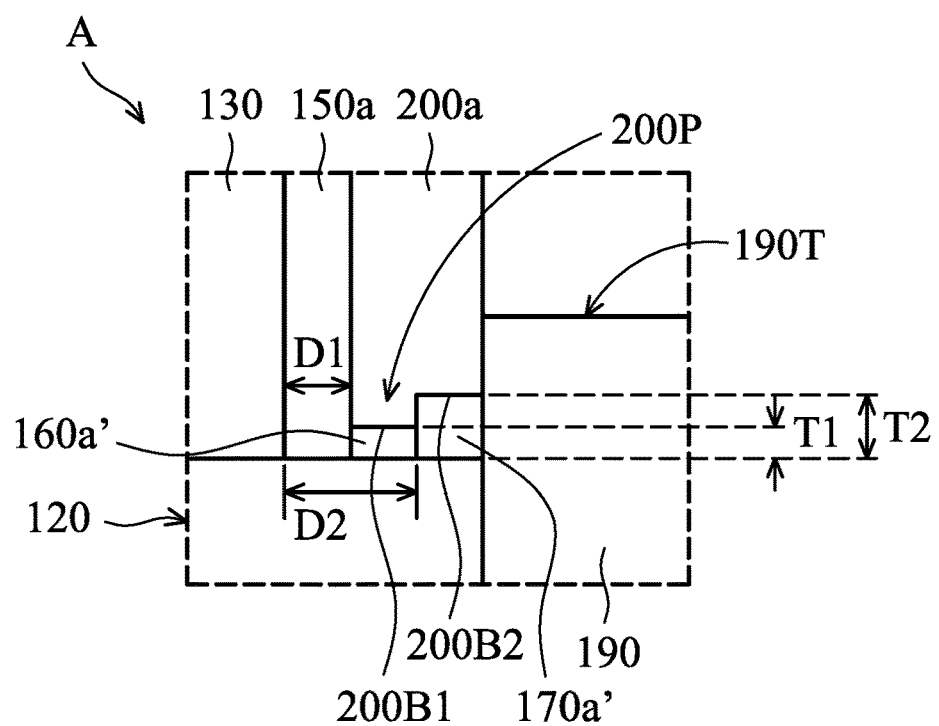

FIG. 3B is a partial enlarged view of area A of structures shown in FIG. 2F, in accordance with some embodiments. In some embodiments, the fourth spacer layers 200a are in direct contact with the top surfaces of the second spacer layer 160a' and the third spacer layer 170a'.

As shown in FIG. 3B, a lower portion of the fourth spacer layers 200a has a first bottom surface 200B1 and a second bottom surface 200B2 corresponding to the top surfaces of the second spacer layer 160a' and the third spacer layer 170a', respectively. The first bottom surface 200B1 is lower than the second bottom surface 200B2, and the second bottom surface 200B2 is lower than the top surface 190T of the S/D structure 190.

In some embodiments, as shown in FIGS. 2F and 3B, the fourth spacer layer 200a has a protruding portion 200P towards the substrate 100 and the fin structure 120. In some embodiments, the protruding portion 200P is positioned between the first spacer layer 150a and the third spacer layer 170a', and the sidewall 170S of the third spacer layer 170a' is covered by the protruding portion 200P. In some embodiments, the protruding portion 200P is directly over the second spacer layer 160a', as shown in FIG. 3B. In addition, the first distance D1 between the protruding portion 200P and the dummy gate structure 130 is shorter than the second distance D2 between the third spacer layer 170a' and the dummy gate structure 130, as shown in FIG. 3B.

In some embodiments, a lower portion of the sidewall of the S/D structure 190 above the fin structure 120 is covered by the third spacer layer 170a' with high dielectric constant (e.g. k>5), and an upper portion of the sidewall of the S/D structure 190 fin structure 120 is covered by the fourth spacer layer 200a with low dielectric constant (e.g. k<5), as shown in FIG. 3B.

Figure 2G:
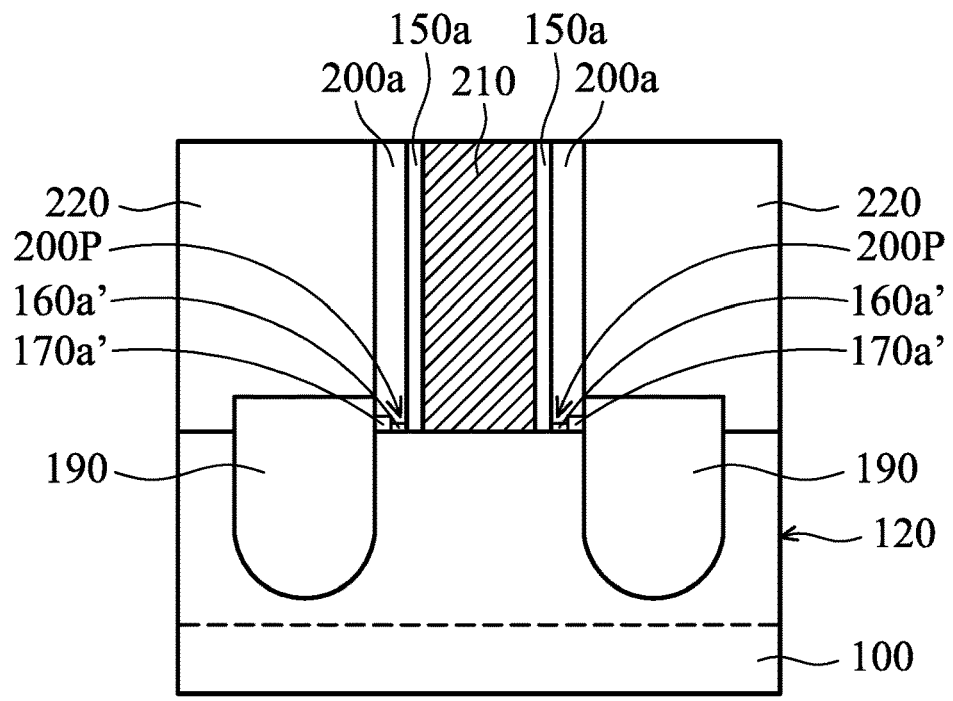

Afterwards, a dielectric layer 220 (such as an inter-layer dielectric (ILD) layer) is formed over the fin structure 120, the fourth spacers 200a, and the S/D structures 190, as shown in FIG. 2G in accordance with some embodiments. In addition, the sidewalls of the fourth spacer layers 200a are covered by the dielectric layer 220.

In some embodiments, a deposition process is performed to form the dielectric layer 220. Afterwards, a planarization process is performed to level the top surfaces of the dielectric layer 220 and the fourth spacers 200a. In some embodiments, the dielectric layer 220 is made of a dielectric material with dielectric constant that is lower than about 5. In some embodiments, the dielectric layer 220 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as porous hydrogen silsesquioxane (HSQ), porous methyl silsesquioxane (MSQ), porous polyarylether (PAE), porous SiLK, or porous silicon oxide ($SiO_2$).

In some embodiments, the deposition process of the dielectric layer 220 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process includes a chemical mechanical polishing (CMP) process, a grinding process, an etching process, another applicable process, or a combination thereof.

After the dielectric layer 220 is formed, a metal gate structure 210 is formed to replace the dummy gate structure 130 by using a removal process, a deposition process, and a subsequent planarization process as shown in FIG. 2G in accordance with some embodiments. In some embodiments, the metal gate structure 210 includes a gate dielectric layer (not shown) and a gate electrode layer (not shown) over the gate dielectric layer. In some embodiments, the first spacer layers 150a, the second spacer layers 160a', the third spacer layers 170a' and the fourth spacer layers 200a are positioned on opposite sidewall surfaces of the metal gate structure 210.

In some embodiments, the gate dielectric layer includes a single layer or multiple layers. In some embodiments, the gate dielectric layer is formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of the gate dielectric layer may include molecular beam deposition (MBD), atomic layer deposition (ALD), plasma enhanced CVD (PECVD), and the like.

In some embodiments, the gate electrode layer is made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in the metal gate structure 210. The work function layer may include N-work-function metal or P-work-function metal. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof.

Figure 2H:
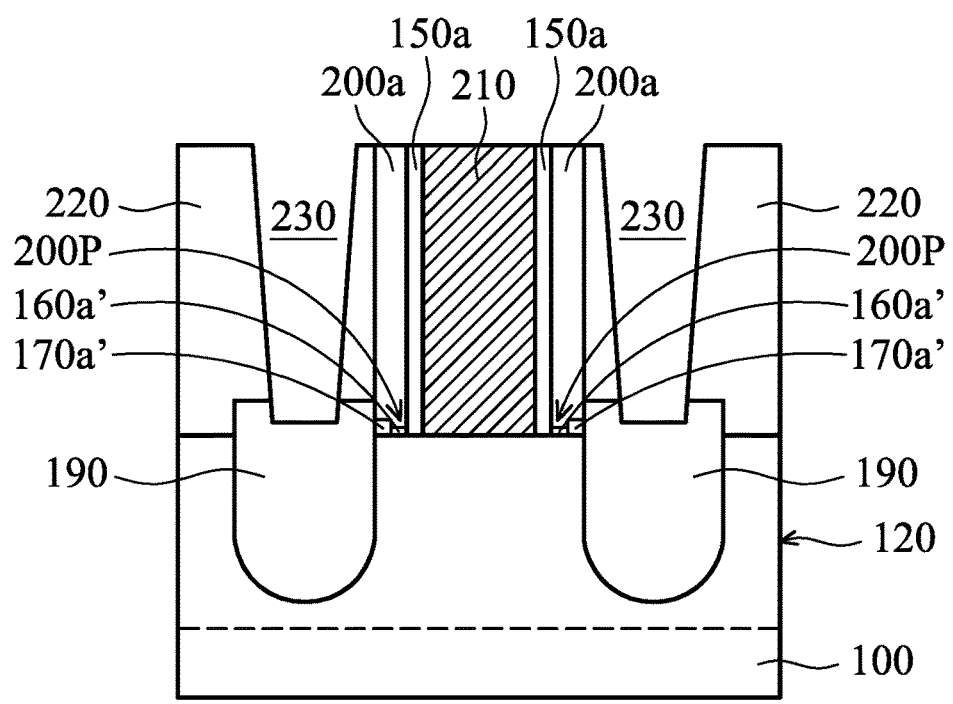

Afterwards, a patterning process is performed to form openings 230 in the dielectric layer 220, as shown in FIG. 2H in accordance with some embodiments. The openings 230 are formed passing through the dielectric layer 220 to expose the S/D structures 190.

The patterning process may include a photolithography process and a subsequent etching process. The photolithography process may be performed to form a mask layer, which may be a photo-sensitive layer such as photoresist, over the dielectric layer 220. The mask layer may have openings directly above to the positions of the S/D structures 190. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process. In addition, etching gases used in the etching process include fluorine-containing (F-containing) gases. After the openings 230 are formed, the mask layer may be removed by etching or any other suitable method.

Figure 2I:
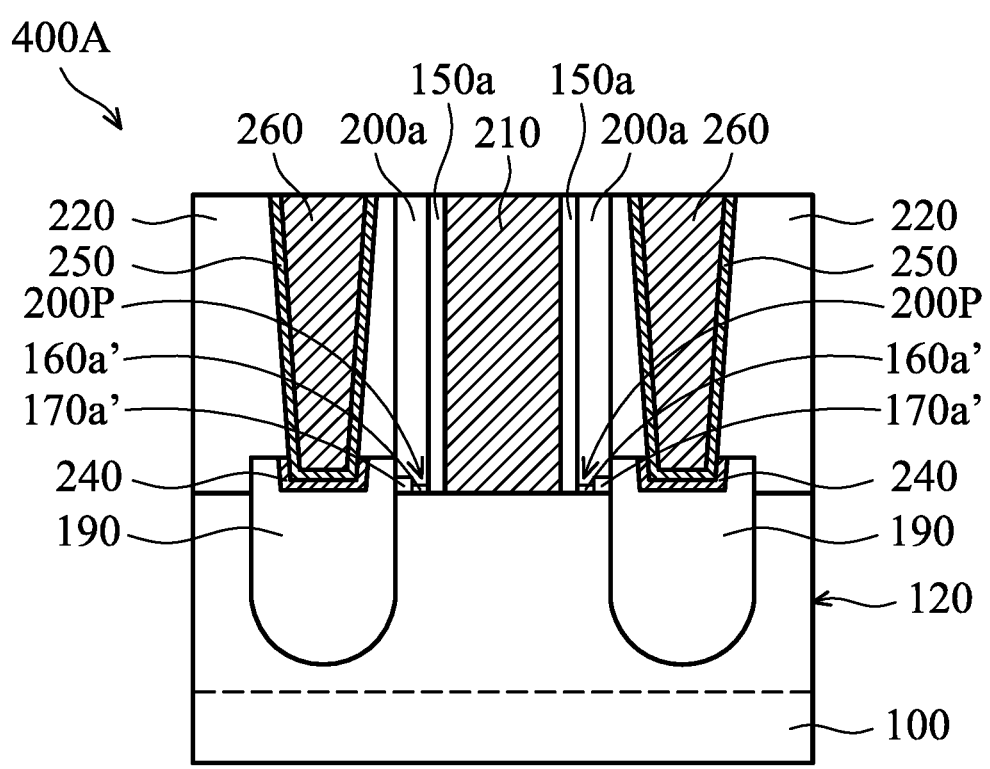

Afterwards, silicide layers 240 are formed on the S/D structures 190 and in the openings 230 by a silicidation process, as shown in FIG. 2I in accordance with some embodiments. The silicide layers 240 may be separated from the metal gate structure 210 through the dielectric layer 220, the first spacer layers 150, and the fourth spacers 200a along the Y-direction.

In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the silicide layers 240 are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide"). The thickness of each of the silicide layers 240 may be in a range from about 1 Å to about 500 nm.

In some embodiments, the bottom surfaces of the openings 230 may be positioned lower the top surfaces of the S/D structures 190. The silicide layers 240 may be formed in the positions leveled with or lower than the top surface of the fin structure 120.

Afterwards, contact barrier layers 250 are formed covering sidewall surfaces and bottom surfaces of the openings 230. The contact barrier layers 250 are formed covering the S/D structures 190 exposed by the openings 230, as shown in FIG. 2I in accordance with some embodiments. In addition, contact plugs 260 are formed filling the openings 230, as shown in FIG. 2I. The contact plugs 260 are formed passing through the dielectric layer 220 and positioned over the S/D structures 190.

As shown in FIG. 2I, the contact barrier layers 250 may be conformally formed over the silicide layers 240 and line the sidewall surfaces and the bottom surfaces of the openings 230. The bottom surfaces of the contact barrier layers 250 are respectively in direct contact with the silicide layers 240.

As shown in FIG. 2I, sidewall surfaces of the contact plugs 260 are covered by the contact barrier layers 250. In addition, the contact plugs 260 are separated from the metal gate structure 210 through the contact barrier layers 250, the dielectric layer 220, the first spacer layers 150a and the fourth spacers 200a along the Y-direction. Furthermore, the contact plugs 260 may be electrically connected to the S/D structures 190. Therefore, the contact plugs 260 may serve as source/drain contact plugs.

In some embodiments, the contact barrier layers 250 and the contact plugs 260 are formed by deposition processes and a subsequent planarization process such as chemical mechanical polishing (CMP) process. The contact barrier layers 250 may include an electrically conductive material such as titanium (Ti), titanium nitride (TiN), tantalum (Ta), tantalum nitride (TaN), nickel (Ni), nickel nitride (NiN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. The contact plugs 260 may be made of a conductive material, such as copper (Cu), aluminum (Al), tungsten (W), titanium (Ti), titanium nitride (TiN), tantalum (Ta), tantalum nitride (TaN), or another applicable material, and may be formed by any suitable deposition method, such as PVD, CVD, ALD or plating (e.g. electroplating). The thickness of each of the contact barrier layers 250 may be in a range from about 1 Å to about 20 Å. The height of each of the contact plugs 260 may be in a range from about 20 Å to about 500 nm. After performing the aforementioned processes, a semiconductor device structure 400A is created, as shown in FIG. 2I.

Figure 4:
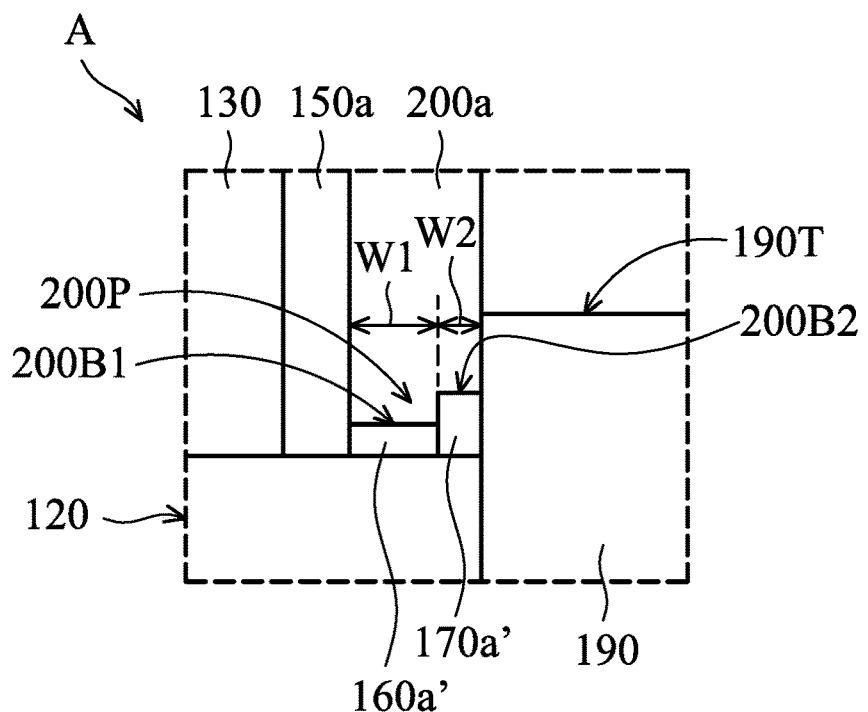
FIGS. 4 and 5 are partial enlarged views of area A of a structures shown in FIG. 2F, in accordance with other some embodiments.

In some embodiments, the width of the first bottom surface 200B1 is the same as that of the second bottom surface 200B2, as shown in FIGS. 2I and 3B. Many variations and/or modifications can be made to embodiments of the disclosure. FIG. 4 is a partial enlarged view of area A of the structure shown in FIG. 2F, in accordance with other some embodiments. In some embodiments, the width of the first bottom surface 200B1 is greater than the width of the second bottom surface 200B2. When the width of the first bottom surface 200B1 is greater than that of the second bottom surface 200B2, more of the low-k dielectric layer fills the space between the subsequently formed metal gate structure 210 and the S/D structure 190. As a result, the parasitic capacitance of the semiconductor device structure is decreased, and the reliability or performance of the semiconductor device structure is improved.

Figure 5:
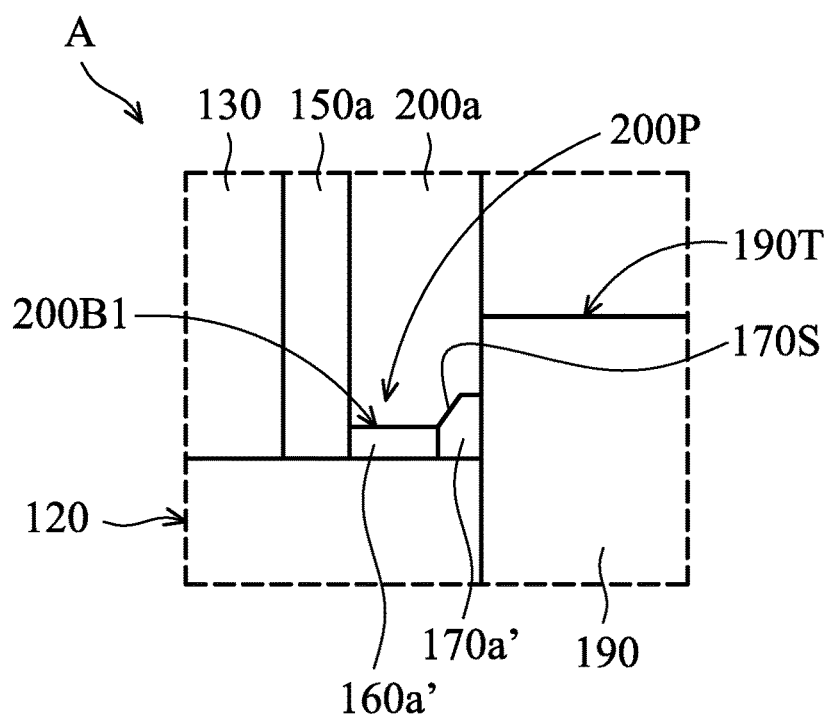

In some embodiments, the sidewall of the third spacer layer 170a' is substantially vertical to the first bottom surface 200B1 of the fourth spacer layer 200a, as shown in FIGS. 2I and 3B. Many variations and/or modifications can be made to embodiments of the disclosure. FIG. 5 is a partial enlarged view of area A of the structure shown in FIG. 2F, in accordance with some other embodiments. In some embodiments, the third spacer layer 170a' has a tapered sidewall 170S so that the protruding portion 200P has an inverted tapered (inverted trapezoidal) profile. The inverted tapered profile has a greater width at the top than at the bottom. More specifically, the protruding portion 200P shrinks from top to bottom. In some embodiments, the angle between the sidewall 170S of the third spacer layer 170a' and the first bottom surface 200B1 of the protruding portion 200P is in a range from about 91 degrees to about 110 degrees. In some embodiments, the angle between the first bottom surface 200B1 and the sidewall 170S is an obtuse angle. More specifically, the protruding portion 200P has an obtuse-angled corner adjacent to the top surface of the second spacer layer 160a' and the sidewall 170S of the third spacer layer 170a'.

Figure 6A:
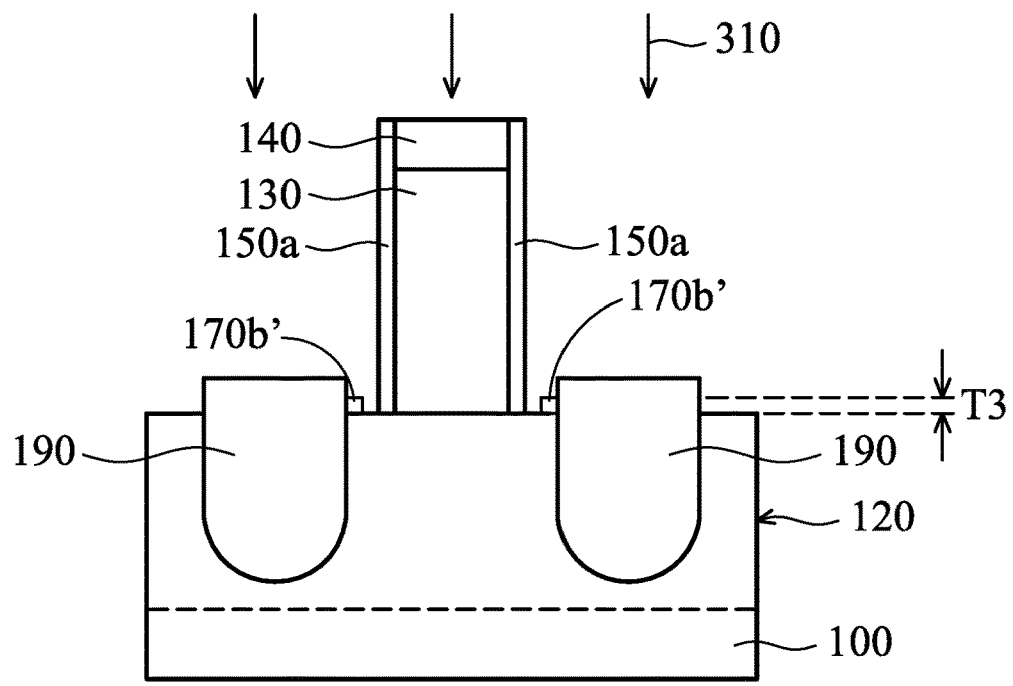
FIGS. 6A-6C are cross-sectional views of various stages of a process for forming a semiconductor device structure, in accordance with some embodiments.
Figure 6B:
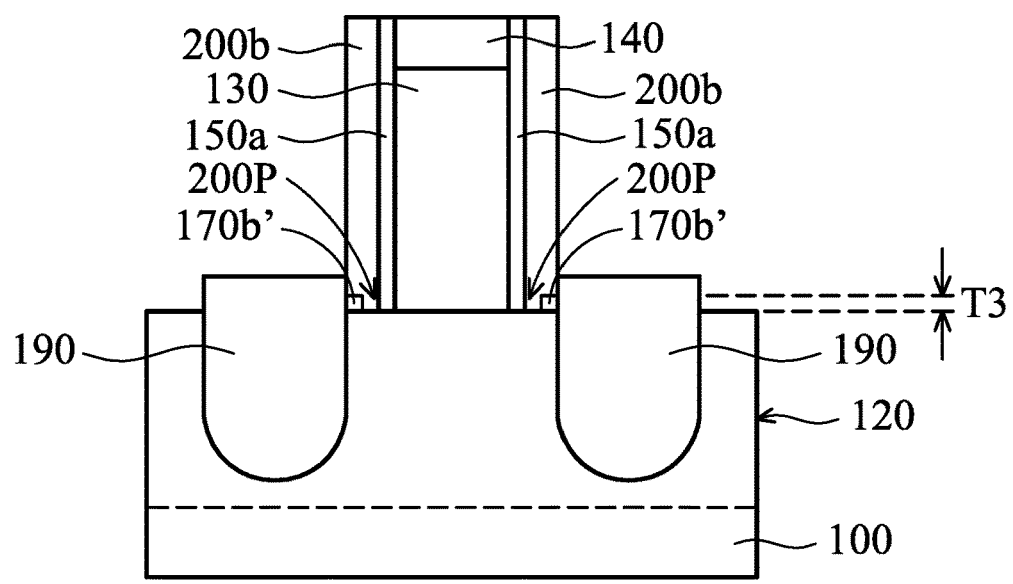
Figure 6C:
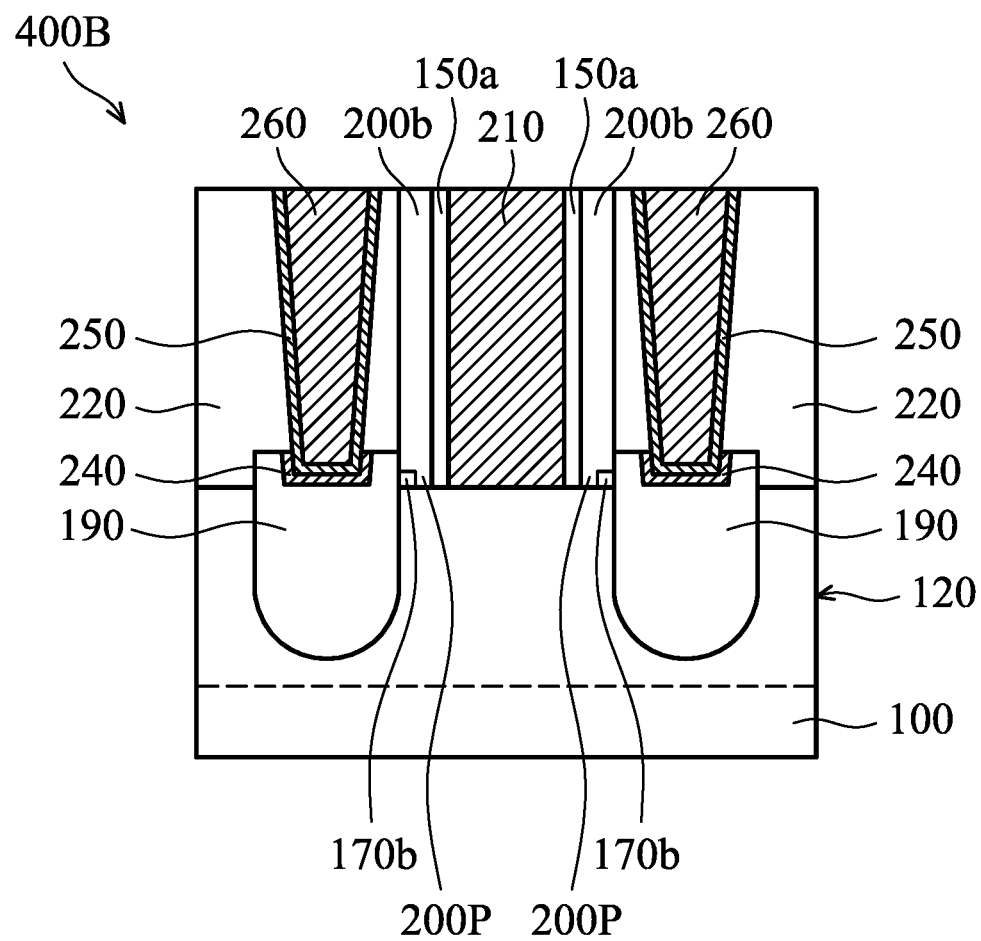

Many variations and/or modifications can be made to embodiments of the disclosure. In some embodiments, the second spacer layer 160a is removed completely so that the protruding portion 200P of the fourth spacer layer 200a is in direct contact with the fin structure 120. FIGS. 6A-6C are cross-sectional views of various stages of a process for forming a semiconductor structure 400B after performing the stage of the process for forming a semiconductor structure shown in FIG. 2D. The materials, configurations, structures and/or processes of the semiconductor structure 400B may be similar to, or the same as, those of the semiconductor structure 400A, and the details thereof are not repeated herein.

An etching process 310 is performed to remove the second spacer layer 160a and the third spacer layer 170a until the second spacer layer 160a is removed completely, as shown in FIG. 6A in accordance with some embodiments. As a result, third spacer layers 170b' are formed. As shown in FIG. 6A, top surfaces and sidewalls of the third spacer layers 170b' are exposed. In addition, the top surface of the fin structure 120 between the first spacer layers 150a and the third spacer layers 170b' is exposed after the etching process 310. In some embodiments, the third spacer layer 170b' has a third thickness T3. Since more portions of the third spacer layers 170a' are removed to form the third spacer layers 170b', the third thickness T3 of the third spacer layer 170b' is less than the second thickness T2 of the third spacer layer 170a' shown in FIG. 3B.

Next, fourth spacer layers 200b are formed over the sidewalls of the first spacer layers 150a, and over top surfaces of the fin structure 120 and the third spacer layers 170b', as shown in FIG. 6B in accordance with some embodiments. In some embodiments, the fourth spacer layers 200b have protruding portions 200P towards the substrate 100 and the fin structure 120, and the protruding portions 200P are in direct contact with the top surface of the fin structure 120, as shown in FIG. 6B.

After the fourth spacer layers 200b are formed, the dielectric layer 220, the silicide layers 240, the contact barrier layers 250 and the contact plugs 260 are formed as shown in FIG. 6C in accordance with some embodiments. As a result, a semiconductor device structure 400B is created. The materials, configurations and/or processes from the structure shown in FIG. 6B to the structure shown in FIG. 6C may be similar to, or the same as, those from the structure shown in FIG. 2G to the structure shown in FIG. 2I, and the details thereof are not repeated herein.

In this embodiment, since the portion of the sidewall of the S/D structure 190 covered by the third spacer layer 170b' is decreased, the interface area between the fourth spacer layer 200b made of a low-K dielectric material and the S/D structure 190 is increased. Therefore, the interface area between the S/D structure 190 and the low-k dielectric material of the fourth spacer layer 200b is increased accordingly. As a result, the parasitic capacitance of the semiconductor device structure 400B is decreased due to there being a larger interface area between the fourth spacer layer 200b and the S/D structure 190. Therefore, the reliability or performance of the semiconductor device structure 400B is improved.

In accordance with some embodiments, semiconductor device structures and methods for forming the semiconductor devices structure are provided. The semiconductor device structures include a low-k spacer layer formed over high-k spacer layers. The low-k spacer layer has a protruding portion towards the substrate so that the parasitic capacitance between the metal gate structure and the S/D structure is decreased. The high-k spacer layers include two layers with different ratios of N concentration so that the two high-k spacer layers have different etching rates. When an etching process is performed to remove the high-k spacer layers, it becomes easy to remove the high-k spacer layers in the trench between the gate structure and the S/D structure due to the difference of the etching rates between two high-k spacer layers. As a result, the high-k spacer layers have different thicknesses. Since the portions of removed high-k spacer layers are increased, the parasitic capacitance between the metal gate structure and the S/D structure is decreased. Therefore, the reliability and performance of the semiconductor device structures are improved.

Embodiments of the disclosure can be applied to not only a semiconductor device structure with N-type or P-type transistors but also a semiconductor device structure with complementary transistors or other suitable devices. Embodiments of the disclosure are not limited and may be applied to fabrication processes for any suitable technology generation. Various technology generations include a 16 nm node, a 10 nm node, a 7 nm node, or another suitable node.

In accordance with some embodiments, a semiconductor device structure is provided. The semiconductor device structure includes a fin structure over a substrate. The semiconductor device structure also includes a gate structure over the fin structure. The semiconductor device structure further includes a source/drain structure adjacent to the gate structure. In addition, the semiconductor device structure includes a first spacer layer between the gate structure and the source/drain structure, wherein the first spacer layer has a protruding portion extending towards the substrate.

In accordance with some embodiments, a semiconductor device structure is provided. The semiconductor device structure includes a gate structure over a substrate. The semiconductor device structure also includes a source/drain structure adjacent to the gate structure. The semiconductor device structure further includes a first spacer layer along a sidewall of the gate structure. In addition, the semiconductor device structure includes a second spacer layer directly under the first spacer layer. The semiconductor device structure also includes a third spacer layer directly under the first spacer layer. The top surface of the second spacer layer is lower than the top surface of the third spacer layer.

In accordance with some embodiments, a method for forming a semiconductor device structure is provided. The method includes forming a fin structure over a substrate and forming a gate structure over the fin structure. The method also includes depositing a first spacer layer over sidewalls of the gate structure. The method further includes depositing a second spacer layer over sidewalls of the first spacer layer. In addition, the method includes epitaxially growing a source/drain structure over the fin structure. The method also includes etching the first spacer layer and the second spacer layer so that top surfaces of the first spacer layer and the second spacer layer are lower than the top surface of the source/drain structure. The method further includes depositing a third spacer layer over the first spacer layer and the second spacer layer so that the third spacer layer has a protruding portion extending towards the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a fin structure over a substrate;
a gate structure over the fin structure;
a source/drain structure adjacent to the gate structure;
a first spacer layer between the gate structure and the source/drain structure, wherein the first spacer layer has a protruding portion extending towards the substrate; and
a second spacer layer directly under the first spacer layer, wherein a top surface of the second spacer layer is lower than a top surface of the source/drain structure.

2. The semiconductor device structure as claimed in claim 1, wherein a dielectric constant of the second spacer layer is higher than a dielectric constant of the first spacer layer.

3. The semiconductor device structure as claimed in claim 2, wherein a sidewall of the second spacer layer is covered by the protruding portion.

4. The semiconductor device structure as claimed in claim 2, wherein a sidewall of the first spacer layer is in direct contact with the source/drain structure, and the protruding portion is in direct contact with the fin structure.

5. The semiconductor device structure as claimed in claim 2, wherein the protruding portion is separated from the source/drain structure by the second spacer layer.

6. The semiconductor device structure as claimed in claim 2, further comprising:
a third spacer layer directly under the protruding portion of the first spacer layer.

7. The semiconductor device structure as claimed in claim 6, wherein a concentration of nitrogen in the second spacer layer is higher than a concentration of nitrogen in the third spacer layer.

8. The semiconductor device structure as claimed in claim 6, wherein the first spacer layer, the second spacer layer and the third spacer layer are made of different materials.

9. The semiconductor device structure as claimed in claim 1, wherein the protruding portion has an obtuse-angled corner.

10. A semiconductor device structure, comprising:
a gate structure over a substrate;
a source/drain structure adjacent to the gate structure;
a first spacer layer along a sidewall of the gate structure;
a second spacer layer directly under the first spacer layer, wherein nitrogen in the second spacer layer has a first concentration; and
a third spacer layer directly under the first spacer layer, wherein a top surface of the second spacer layer is lower than a top surface of the third spacer layer, and nitrogen in the third spacer layer has a second concentration that is higher than the first concentration.

11. The semiconductor device structure as claimed in claim 10, wherein the top surface of the third spacer layer is lower than a top surface of the source/drain structure.

12. The semiconductor device structure as claimed in claim 10, wherein a width of a top portion of the third spacer layer is less than a width of a bottom portion of the third spacer layer.

13. The semiconductor device structure as claimed in claim 10, wherein a dielectric constant of the first spacer layer is lower than those of the second spacer layer and the third spacer layer.

14. The semiconductor device structure as claimed in claim 10, wherein the first spacer layer has a tapered sidewall.

15. A semiconductor device structure, comprising:
a gate structure over a substrate;
a source/drain structure adjacent to the gate structure;
a first spacer layer along a sidewall of the gate structure;
a second spacer layer directly under the first spacer layer; and
a third spacer layer directly under the first spacer layer, wherein a width of the second spacer layer is greater than a width of the third spacer layer, and a dielectric constant of the first spacer layer is lower than a dielectric constant of the second spacer layer and a dielectric constant of the third spacer layer.

16. The semiconductor device structure as claimed in claim 15, wherein the second spacer layer has a first nitrogen concentration, and the third spacer layer has a second nitrogen concentration that is greater than the first nitrogen concentration.

17. The semiconductor device structure as claimed in claim 15, wherein the first spacer layer is separated from the substrate by the second spacer layer and the third spacer layer.

18. The semiconductor device structure as claimed in claim 15, wherein a sidewall surface of the third spacer layer is in direct contact with the first spacer layer.

19. The semiconductor device structure as claimed in claim 6, wherein a dielectric constant of the third spacer layer is higher than a dielectric constant of the first spacer layer.

20. The semiconductor device structure as claimed in claim 6, wherein a top surface of the third spacer layer is lower than the top surface of the source/drain structure.

* * * * *